United States Patent
Hsu et al.

(10) Patent No.: US 8,610,006 B2
(45) Date of Patent: Dec. 17, 2013

(54) LID FOR MICRO-ELECTRO-MECHANICAL DEVICE AND METHOD FOR FABRICATING THE SAME

(75) Inventors: Shih-Ping Hsu, Taoyuan (TW); Kun-Chen Tsai, Taoyuan (TW); Micallaef Ivan, Taoyuan (TW)

(73) Assignee: Unimicron Technology Corporation, Taoyuan (TW)

(*) Notice: Subject to any disclaimer, the term of this patent is extended or adjusted under 35 U.S.C. 154(b) by 1090 days.

(21) Appl. No.: 12/604,907

(22) Filed: Oct. 23, 2009

(65) Prior Publication Data

US 2010/0108345 A1    May 6, 2010

(30) Foreign Application Priority Data

Oct. 30, 2008 (TW) ................ 97141729 A

(51) Int. Cl.
*H01L 23/28* (2006.01)
(52) U.S. Cl.
USPC ........... 174/522; 381/355; 174/265; 174/255; 174/262; 257/704
(58) Field of Classification Search
USPC ............ 174/50, 250–268, 522, 524, 521; 257/704; 381/355, 361, 360
See application file for complete search history.

(56) References Cited

U.S. PATENT DOCUMENTS

| | | | | |
|---|---|---|---|---|
| 6,631,838 B2* | 10/2003 | Kim et al. | | 228/225 |
| 7,065,867 B2* | 6/2006 | Kim et al. | | 29/841 |
| 7,443,693 B2* | 10/2008 | Arnold et al. | | 361/800 |
| 7,692,288 B2* | 4/2010 | Zhe et al. | | 257/704 |
| 2002/0023778 A1* | 2/2002 | Watanabe | | 174/262 |
| 2003/0183920 A1* | 10/2003 | Goodrich et al. | | 257/701 |
| 2004/0259325 A1* | 12/2004 | Gan | | 438/456 |
| 2005/0263878 A1* | 12/2005 | Potter | | 257/704 |
| 2005/0288392 A1* | 12/2005 | Okubora | | 523/176 |
| 2006/0118946 A1* | 6/2006 | Alie et al. | | 257/704 |
| 2007/0000687 A1* | 1/2007 | Brist et al. | | 174/255 |
| 2007/0071268 A1* | 3/2007 | Harney et al. | | 381/355 |
| 2007/0205499 A1* | 9/2007 | Wang et al. | | 257/704 |
| 2008/0121420 A1* | 5/2008 | Magera et al. | | 174/262 |
| 2008/0315398 A1* | 12/2008 | Lo et al. | | 257/693 |
| 2009/0215228 A1* | 8/2009 | Yang | | 438/107 |
| 2010/0177922 A1* | 7/2010 | Park et al. | | 381/355 |

* cited by examiner

*Primary Examiner* — Jinhee Lee
*Assistant Examiner* — Christopher L Augustin
(74) *Attorney, Agent, or Firm* — Edwards Wildman Palmer LLP; Peter F. Corless; Steven M. Jensen

(57) ABSTRACT

A lid for a micro-electro-mechanical device and a method for fabricating the same are provided. The lid includes a board with opposite first and second surfaces and a first conductor layer. The first surface has a first metal layer thereon. The first metal layer and the board have a recess formed therein. The recess has a bottom surface and a side surface adjacent thereto. The first conductor layer is formed on the first metal layer and the bottom and side surfaces of the recess. The shielding effect of the side surface of the board is enhanced because of the recess integral to the board, the homogeneous bottom and side surfaces of the recess, and the first conductor layer covering the first metal layer, the bottom and side surfaces of the recess.

3 Claims, 3 Drawing Sheets

LID FOR MICRO-ELECTRO-MECHANICAL DEVICE AND METHOD FOR FABRICATING THE SAME

BACKGROUND OF THE INVENTION

1. Field of the Invention

The present invention relates to lids, and more particularly, to a lid for use in a micro-electro-mechanical device to have an enhanced shielding effect upon the micro-electro-mechanical device and a method for fabricating the same.

2. Description of the Prior Art

Micro-electro-mechanical devices, such as microphones, are in wide use in mobile communication devices, audio devices, etc. To achieve miniaturization, microphones for use as hearing aid units, typically known as condenser microphones, are downsized. However the transducers therein are fragile and susceptible to physical damage. Furthermore, since signal transmission is subject to be interfered with by the environment, the transducer must be protected from light and electromagnetic interferences. Moreover, favorable acoustic pressure is required for the transducer to function properly, as far as prevention of light and electromagnetic interference is concerned. Please refer to FIG. 1 for condenser microphones in wide use.

Referring to FIG. 1, a conventional condenser microphone comprises: a first substrate 10, a conductive plate 11 coupled to the first substrate 10 by means of a conductive adhesive layer 13, and a second substrate 12 coupled to the conductive plate 11 by means of another conductive adhesive layer 13'. The first substrate 10 comprises a mold plate 100 and a backboard 101, and so does the second substrate 12. An auditory aperture 102 is formed in the first substrate 10. A semiconductor chip 14 is mounted on the first substrate 10. Also, a transducer 15 above the auditory aperture 102 is mounted on the first substrate 10. A through cavity 110 formed in the conductive plate 11 not only provides room for different acoustic pressures but also receives the semiconductor chip 14 and the transducer 15.

The conventional condenser microphone provides a protective space defined by the first substrate 10, the through cavity 110 of the conductive plate 11, and the second substrate 12, so as to insulate the semiconductor chip 14 and the transducer 15 and achieve the shielding effect. However, the conductive adhesive layer 13 and the conductive plate 11 differ from each other in constituents, thus deteriorating the shielding effect of the side surface of the condenser microphone.

Accordingly, an issue that calls for immediate solution involves endeavors to overcome the aforesaid drawbacks of the prior art.

SUMMARY OF THE INVENTION

In light of the aforesaid drawbacks of the prior art, it is a primary objective of the present invention to provide a lid for use in a micro-electro-mechanical device and a method for fabricating the same with a view to boosting the shielding effect upon the micro-electro-mechanical device.

To achieve the above and other objectives, the present invention discloses a lid for use in a micro-electro-mechanical device. The lid comprises: a board with opposite first and second surfaces, the first surface having a first metal layer disposed thereon, wherein the first metal layer and the board have a recess therein to penetrate the first metal layer and extend into the board, and the recess has a bottom surface and a side surface adjacent thereto; and a first conductor layer disposed on the first metal layer and the bottom surface and the side surface of the recess.

The lid further has a hole which spans from the second surface of the board to the bottom surface of the recess and penetrates the first conductor layer. A surface treatment layer made of nickel, palladium, gold, tin, or a combination thereof is disposed on the first conductor layer.

The present invention further discloses a method for fabricating a lid for a micro-electro-mechanical device, comprising the steps of: providing a board with a first surface having an initial metal layer thereon and an opposite second surface; roughening the initial metal layer such that the initial metal layer forms a first metal layer; forming a recess to penetrate the first metal layer, cross the first surface, and extend into the board such that the recess thus formed has a bottom surface and a side surface adjacent thereto; forming a first conductor layer on the first metal layer and the bottom surface and the side surface of the recess, and forming a second conductor layer on the second surface of the board; forming a resist layer on the first conductor layer; removing the second conductor layer; and removing the resist layer.

Alternatively, the second surface of the board also has an initial metal layer thereon, and thus a second metal layer is formed as well as the first metal layer by roughening, and the second metal layer is subsequently removed as well as the second conductor layer.

The method further comprises roughening and thinning the initial metal layer by an etching process.

The method further comprises forming a hole to span from the second surface of the board to the bottom surface of the recess and penetrate the first conductor layer. Also, the method further comprises forming on the first conductor layer a surface treatment layer made of nickel, palladium, gold, tin, or a combination thereof.

Unlike its conventional counterpart, the bottom surface and the side surface of the recess are integrally formed in the board of the present invention, and a first conductor layer is disposed to coat the bottom surface and the side surface of the recess. Hence, the shielding effect upon the micro-electromechanical device of the present invention is enhanced.

DETAILED DESCRIPTION OF THE EMBODIMENTS

The present invention is herein illustrated with specific embodiments, so that one skilled in the pertinent art can easily understand other advantages and effects of the present invention from the disclosure of the invention.

Figure 1:
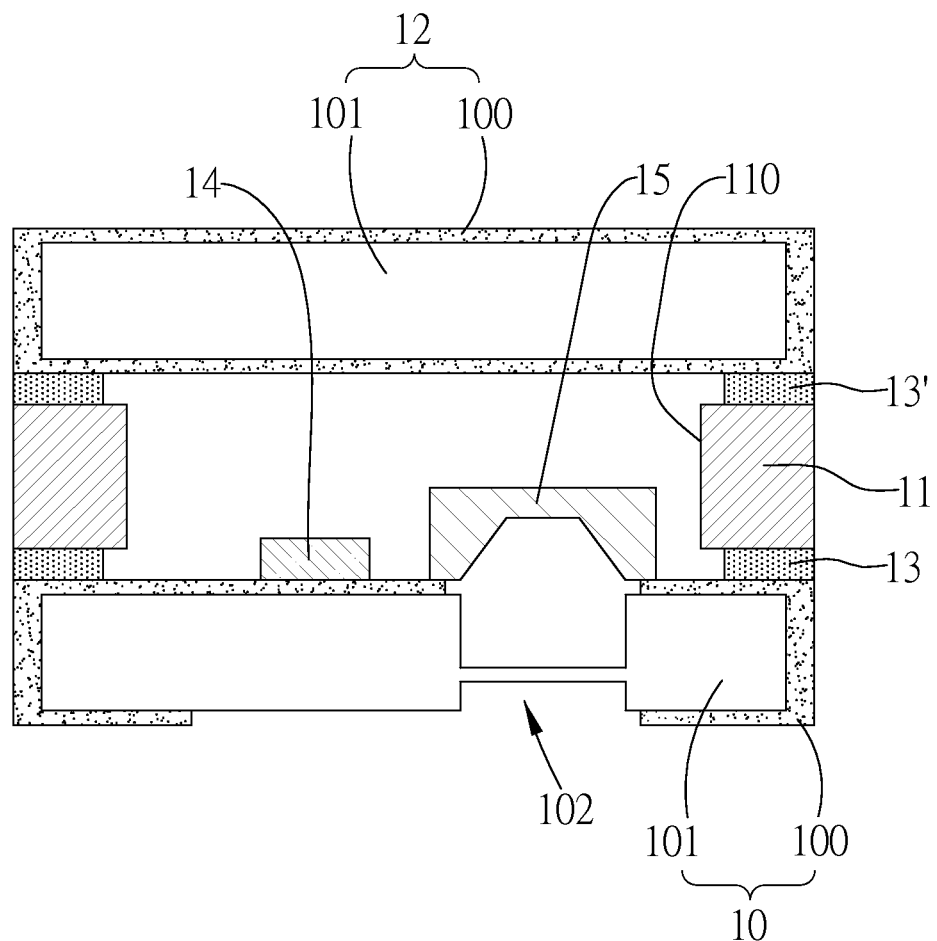
FIG. 1 (PRIOR ART) is a cross-sectional view of a conventional condenser microphone.
Figure 2A:
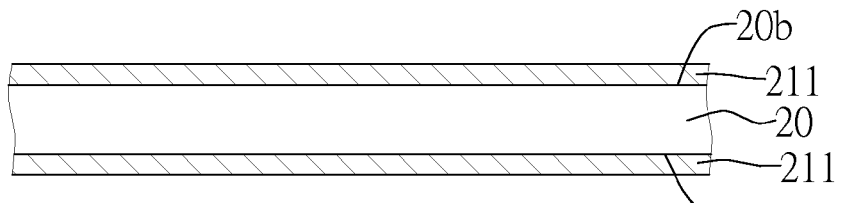
FIGS. 2A through 2J are cross-sectional views of a method for fabricating a lid of a micro-electro-mechanical device of the present invention.

FIGS. 2A through 2J are cross-sectional views of a method for fabricating a lid of a micro-electro-mechanical device of the present invention. Referring to FIG. 2A, a board 20 with opposite first and second surfaces 20a, 20b is provided. The board 20 is made of polymer material, such as BT (Bismaleimide-triazine) core material or plastics. Two initial metal layers 211 are formed on the first and second surfaces 20a, 20b, respectively.

Figure 2B:
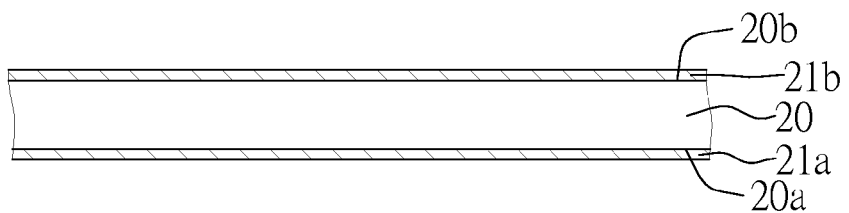

Referring to FIG. 2B, the initial metal layers 211 on the first and second surfaces 20a, 20b are roughened and thinned by an etching process, so as to form a first metal layer 21a from the initial metal layer 211 on the first surface 20a and form a second metal layer 21b from the initial metal layer 211 on the second surface 20b.

Figure 2C:
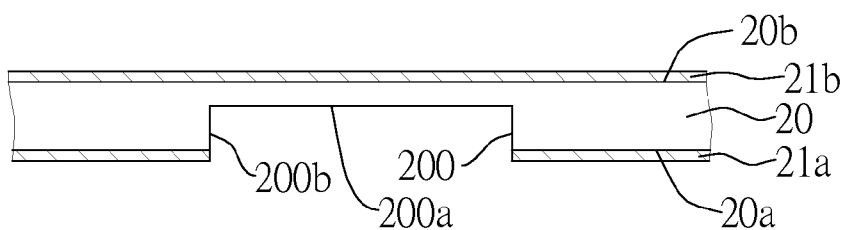

Referring to FIG. 2C, a recess 200 is formed to penetrate the first metal layer 21a, cross the first surface 20a, and extend into the board 20. The recess 200 has a bottom surface 200a and a side surface 200b adjacent thereto.

Figure 2D:
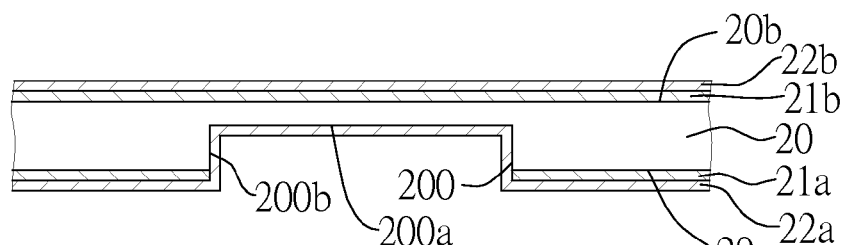

Referring to FIG. 2D, a first conductor layer 22a is formed on the first metal layer 21a and the bottom surface 200a and the side surface 200b of the recess 200, and a second conductor layer 22b is formed on the second metal layer 21b. Alternatively, a seed layer (not shown) is formed prior to the formation of the first and second conductor layers 22a, 22b which are made of metal such as copper. The seed layer functions as an electrical conduction path for electroplating and comprises metal, alloy, and a plurality of deposited metal layers.

Figure 2E:
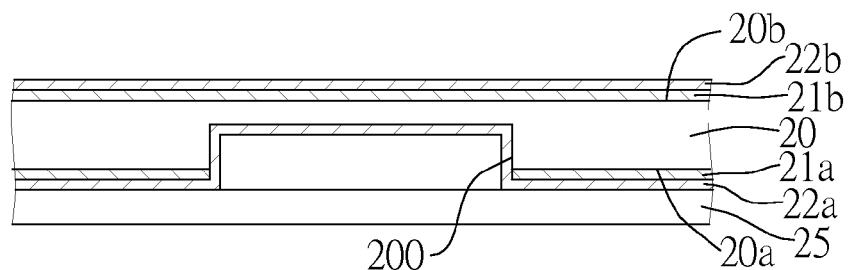
Figure 2F:
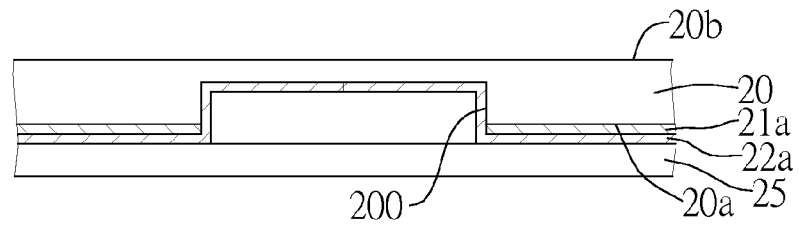

Referring to FIGS. 2E and 2F, a resist layer 25 is formed above the first conductor layer 22a as shown in FIG. 2E, and then the second conductor layer 22b together with the second metal layer 21b are removed as shown in FIG. 2F.

Figure 2G:
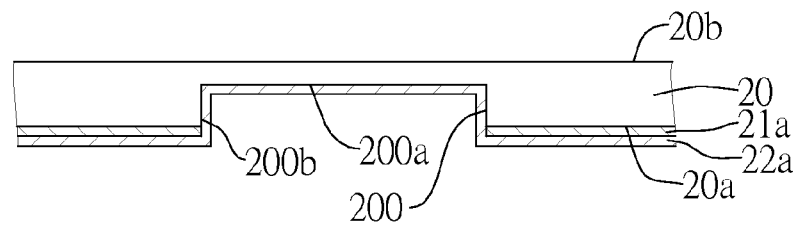
Figure 2H:
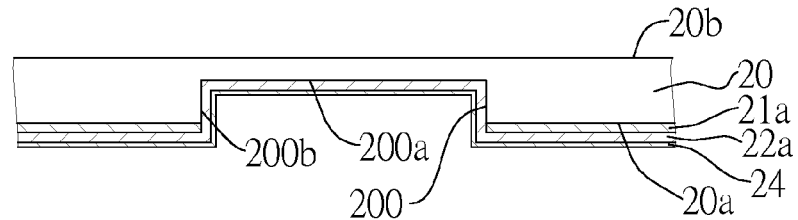

Referring to FIGS. 2G and 2H, the resist layer 25 is removed as shown in FIG. 2G, and then a surface treatment layer 24 made of nickel, palladium, gold, tin, or a combination thereof is formed on the first conductor layer 22a as shown in FIG. 2H.

As disclosed in the present invention, the shielding effect of the side surface of the board 20 is enhanced, not only because the recess 200 is integrally formed in the board 20, wherein the bottom surface 200a and the side surface 200b of the recess 200 are made of the same material, but because the inside of the recess 200 is readily covered with the same material (e.g., the first conductor layer 22a).

Figure 2I:
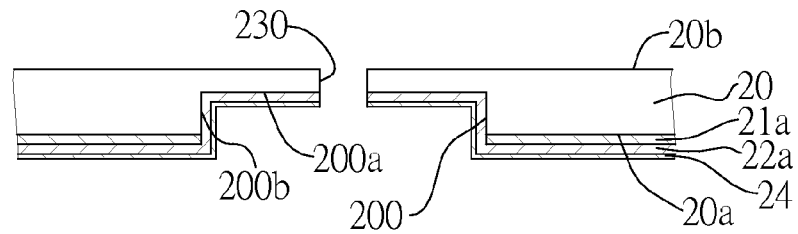

Referring to FIG. 2I, a hole 230 is formed to span from the second surface 20b of the board 20 to the bottom surface 200a of the recess 200 and penetrate the first conductor layer 22a and the surface treatment layer 24.

Figure 2J:
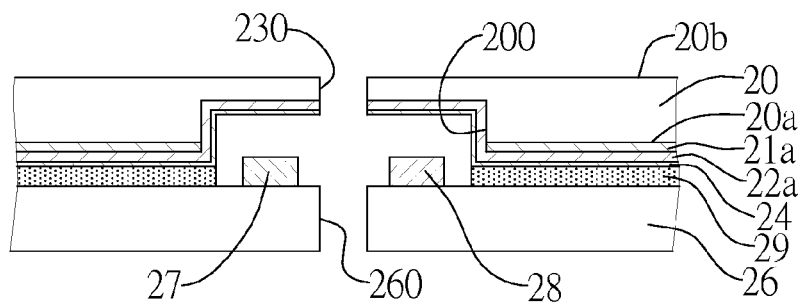

Referring to FIG. 2J, in an ensuing process, the present invention is applied to a carrier board 26, such as a circuit board, so as to form a micro-electro-mechanical device. Semiconductor components 27, 28, such as an MEMS chip or an ASIC chip, are mounted on the carrier board 26. The carrier board 26 is coupled to the first conductor layer 22a on the first surface 20a of the board 20 via a conductive coupling layer 29. The semiconductor components 27, 28 are received in the recess 200. A through hole 260 is optionally formed in the carrier board 26.

The present invention further provides a lid for a micro-electro-mechanical device. The lid comprises a board 20 and a first conductor layer 22a. The board 20 has opposite first and second surfaces 20a, 20b. The first surface 20a has a first metal layer 21a disposed thereon. A recess 200 is formed to penetrate the first metal layer 21a and extend into the board 20. The recess 200 has a bottom surface 200a and a side surface 200b adjacent thereto.

The first conductor layer 22a is disposed on the first metal layer 21a and the bottom surface 200a and side surface 200b of the recess 200. A surface treatment layer 24 made of nickel, palladium, gold, tin, or a combination thereof is formed on the first conductor layer 22a. The board 20 has a hole 230 formed therein. The hole 230 spans from the second surface 20b of the board 20 to the bottom surface 200b of the recess 200 and penetrates the first conductor layer 22a.

The foregoing specific embodiments are intended to illustrate the features and functions of the present invention but are not intended to restrict the scope of the present invention. It is apparent to those skilled in the art that all equivalent modifications and variations made in the foregoing embodiments according to the spirit and principle in the disclosure of the present invention should fall within the scope of the appended claims.

What is claimed is:

1. A lid of a micro-electro-mechanical device, comprising:
   a board with opposite first and second surfaces, the first surface having a first metal layer disposed thereon, wherein the first metal layer and the board have a recess therein to penetrate the first metal layer and extend into the board, and the recess has a bottom surface and a side surface adjacent thereto; and
   a first conductor layer disposed on the first metal layer and the bottom surface and the side surface of the recess; and
   a hole to span from the second surface of the board to the bottom surface of the recess and penetrate the first conductor layer.

2. The lid of claim 1, further comprising a surface treatment layer disposed on the first conductor layer.

3. The lid of claim 2, wherein the surface treatment layer is made of one selected from the group consisting of nickel, palladium, gold, tin, and a combination thereof.

* * * * *